(12) United States Patent
Toda

(10) Patent No.: US 9,214,226 B2
(45) Date of Patent: Dec. 15, 2015

(54) SEMICONDUCTOR MEMORY DEVICE

(75) Inventor: Haruki Toda, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 140 days.

(21) Appl. No.: 14/005,149

(22) PCT Filed: Mar. 7, 2012

(86) PCT No.: PCT/JP2012/056486
§ 371 (c)(1),
(2), (4) Date: Sep. 13, 2013

(87) PCT Pub. No.: WO2012/128134
PCT Pub. Date: Sep. 27, 2012

(65) Prior Publication Data
US 2014/0009997 A1    Jan. 9, 2014

(30) Foreign Application Priority Data

Mar. 24, 2011  (JP) .................................. 2011-065619

(51) Int. Cl.
*G11C 29/00* (2006.01)
*G11C 13/00* (2006.01)
*H01L 27/115* (2006.01)

(52) U.S. Cl.
CPC ............ *G11C 13/003* (2013.01); *G11C 13/004* (2013.01); *G11C 13/0023* (2013.01);
(Continued)

(58) Field of Classification Search
CPC .............. G11C 13/004; G11C 13/003; G11C 13/0069; G11C 13/0011; G11C 2013/0073; G11C 13/0023; G11C 2213/72; G11C 2213/71; H01L 27/115

USPC .......................................................... 365/148
See application file for complete search history.

(56) References Cited

U.S. PATENT DOCUMENTS 6,980,465 B2   12/2005   Taussig et al.
7,236,389 B2    6/2007   Hsu
(Continued)

FOREIGN PATENT DOCUMENTS

JP   2005-522045 A   7/2005
JP    2010-20863 A   1/2010
(Continued)

OTHER PUBLICATIONS

U.S. Appl. No. 14/079,005, filed Nov. 13, 2013, Toda.
(Continued)

*Primary Examiner* — Vanthu Nguyen
*Assistant Examiner* — Xiaochun L Chen
(74) *Attorney, Agent, or Firm* — Oblon, McClelland, Maier & Neustadt, L.L.P.

(57) ABSTRACT

A semiconductor memory device including a memory cell array including a memory cell layer containing plural memory cells operative to store data in accordance with different resistance states; and an access circuit operative to make access to the memory cells, the memory cell changing the resistance state from a first resistance state to a second resistance state on application of a voltage of a first polarity, and changing the resistance state from the second resistance state to the first resistance state on application of a voltage of a second polarity, the access circuit applying voltages, required for access to the memory cell, to first and second lines connected to a selected memory cell, and bringing at least one of the first and second lines connected to non-selected memory cells into the floating state to make access to the selected memory cell.

4 Claims, 15 Drawing Sheets

(52) U.S. Cl.
CPC .......... *H01L27/115* (2013.01); *G11C 13/0011* (2013.01); *G11C 2013/0073* (2013.01); *G11C 2213/71* (2013.01); *G11C 2213/72* (2013.01)

(56) References Cited

U.S. PATENT DOCUMENTS

| | | | |
|---|---|---|---|
| 7,889,538 B2 | 2/2011 | Toda | |
| 7,986,575 B2 * | 7/2011 | Inaba | 365/200 |
| 7,989,789 B2 | 8/2011 | Toda | |
| 7,995,392 B2 | 8/2011 | Shibata | |
| 8,023,313 B2 | 9/2011 | Toda | |
| 8,094,477 B2 | 1/2012 | Maejima | |
| 8,094,483 B2 | 1/2012 | Nakai et al. | |
| 8,488,365 B2 * | 7/2013 | Liu et al. | 365/148 |
| 8,537,595 B2 * | 9/2013 | Toda | 365/148 |
| 8,681,531 B2 * | 3/2014 | Liu et al. | 365/148 |
| 2010/0008125 A1 * | 1/2010 | Inaba | 365/148 |
| 2010/0027308 A1 | 2/2010 | Maejima | |
| 2010/0054019 A1 | 3/2010 | Toda | |
| 2010/0295012 A1 | 11/2010 | Mikawa et al. | |
| 2011/0140070 A1 | 6/2011 | Kim | |
| 2012/0002458 A1 * | 1/2012 | Toda | 365/148 |
| 2012/0218806 A1 * | 8/2012 | Liu et al. | 365/148 |
| 2013/0279239 A1 * | 10/2013 | Liu et al. | 365/148 |
| 2014/0154860 A1 * | 6/2014 | Liu et al. | 438/382 |

FOREIGN PATENT DOCUMENTS

| | | |
|---|---|---|
| JP | 2010-33675 A | 2/2010 |
| JP | 2010-55719 A | 3/2010 |
| JP | 2010-129216 | 6/2010 |

OTHER PUBLICATIONS

U.S. Appl. No. 14/078,948, filed Nov. 13, 2013, Toda.
International Search Report and Written Opinion issued Jun. 26, 2012 in PCT/JP2012/056486.
Taiwanese Office Action issued Mar. 12, 2015 in Patent Application No. 101107045 (with English Translation and English Translation of Category of Cited Documents).
Office Action issued Feb. 2, 2015 in Chinese Patent Application No. 201280014572.4 (with English language translation).

* cited by examiner

SEMICONDUCTOR MEMORY DEVICE

CROSS-REFERENCE TO RELATED APPLICATIONS

This application is based upon and claims the benefit of priority from the prior Japanese Patent Application No. 2011-65619, filed on Mar. 24, 2011, the entire contents of which are incorporated herein by reference.

FIELD

The embodiment relates to a semiconductor memory device.

BACKGROUND

As semiconductor memory devices capable of storing mass data for use, variable resistance memories (ReRAM: Resistance Random Access Memory) and so forth, which can be easily formed in three dimensions, have received attention. Cells of these variable resistance memories are characterized in the asymmetry of the voltage-current characteristic that greatly changes in accordance with the polarity of the voltage applied to the memory cell.

Conventionally, the semiconductor memory device including the variable resistance memory cells distinguishes a selection-targeted memory cell (hereinafter referred to as a "selected memory cell") from other memory cells (hereinafter referred to as "non-selected memory cells") by applying a bias, different from that to the selected memory cell, to all non-selected memory cells from external to make access to the selected memory cell. In accordance with setting of the bias, it is possible to increase the margin of failed operation of non-selected memory cells, thereby ensuring reliable operation of the cell array. The setting of the bias is not easy, however, and when it is intended to make access under an optimal bias condition, an increase occurs in current consumption, for example, as a problem.

Therefore, when these variable resistance memories are used in mass storage semiconductor memory devices, the size of the access-target cell array cannot be increased sufficiently. As a result, the share of memory cells in a semiconductor memory device lowers and the merit of the three-dimensional structure cannot be exerted sufficiently.

[Patent Document 1] JP 2010-33675A

DETAILED DESCRIPTION

A semiconductor memory device comprises a memory cell array including a memory cell layer, the memory cell layer containing plural first lines, plural second lines intersecting the first lines, and plural memory cells provided at the intersections of the plural first lines and second lines and operative to store data in accordance with different resistance states; and an access circuit operative to make access to the memory cells via the first lines and second lines, the memory cell changing the resistance state from a first resistance state to a second resistance state on application of a certain voltage of a first polarity, and changing the resistance state from the second resistance state to the first resistance state on application of a certain voltage of a second polarity opposite in polarity to the first polarity, and the access circuit applying voltages, required for access to the memory cell, to the first line and the second line connected to a selected memory cell, and bringing at least one of the first lines and the second lines connected to non-selected memory cells into the floating state to make access to the selected memory cell.

Semiconductor memory devices according to the embodiments will now be described below with reference to the drawings.

First Embodiment

Configuration of Semiconductor Memory Device

Figure 1:
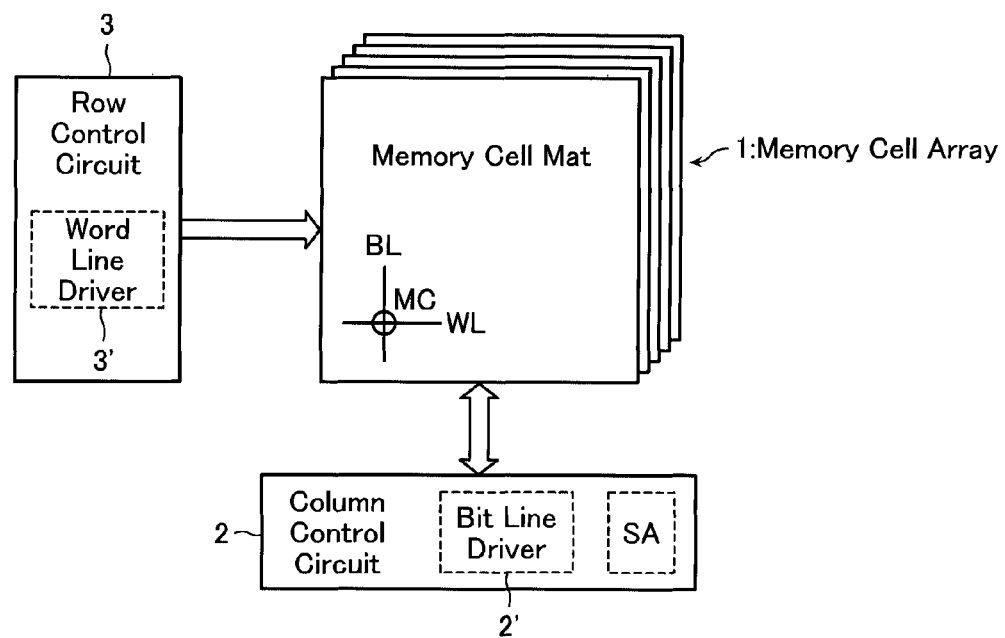
FIG. 1 is a diagram showing the configuration of a semiconductor memory device according to a first embodiment.

FIG. 1 is a diagram showing the configuration of a semiconductor memory device according to a first embodiment. This semiconductor memory device comprises a memory cell array 1. The memory cell array 1 includes plural stacked memory cell mats (memory cell layers). Each memory cell mat contains plural bit lines BL (first lines) and plural word lines WL (second lines), and memory cells MC selected by these word lines WL and bit lines BL.

The bit lines BL in the memory cell mat are electrically connected to a column control circuit 2 operative to control the bit lines BL and execute erasing data in the memory cell MC, writing data in the memory cell MC and reading data from the memory cell MC (hereinafter, erasing data in the memory cell MC and writing data in the memory cell MC are referred to as "write operation" collectively and reading data from the memory cell MC is referred to as "read operation". In addition, write operation and read operation are referred to as "access operation" collectively). The column control circuit 2 includes a bit line driver 2' operative to supply a voltage, required for access operation, to the bit line BL, and a sense amplifier SA operative to sense and amplify the current flowing in the memory cell MC at the time of read operation to determine the data stored in the memory cell MC.

On the other hand, the word lines WL in the memory cell mat are electrically connected to a row control circuit 3 operative to select among the word lines WL at the time of access operation. The row control circuit 3 includes a word line driver 3' operative to supply a voltage, required for access operation, to the word line WL. The row control, circuit 3, together with the column control circuit 2, is contained in an access circuit.

Figure 2:
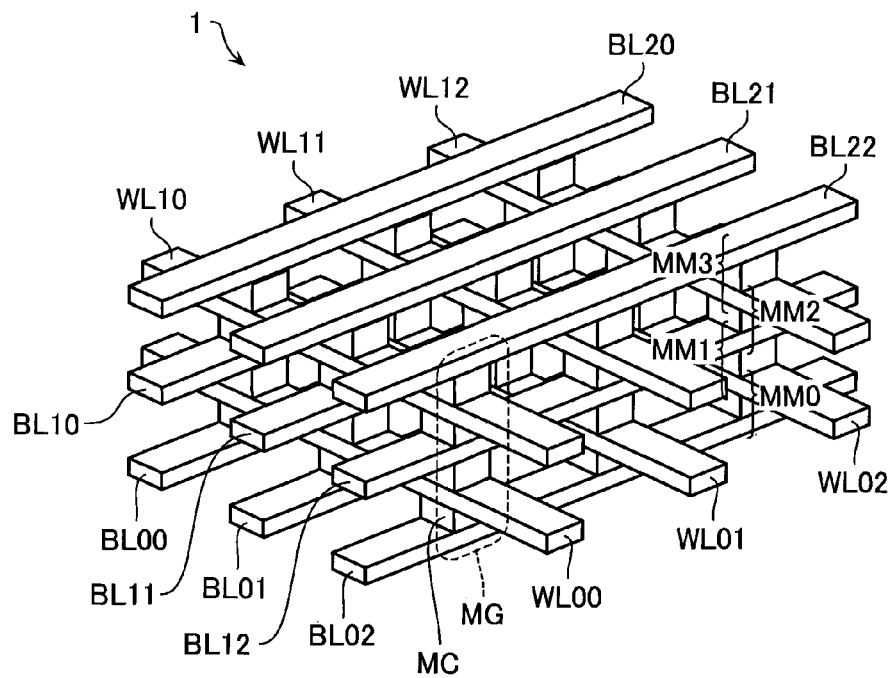
FIG. 2 is a perspective view of a part of a memory cell array in the semiconductor memory device according to the same embodiment.

FIG. 2 is a perspective view showing a part of the memory cell array 1.

The memory cell array 1 is a memory cell array of the cross-point type. The memory cell mat MM in the memory cell array 1 includes plural bit lines BL disposed in parallel, and plural word lines WL disposed in parallel in the direction of intersecting the bit lines BL. Each intersection of the bit line BL and the word line WL is provided with a memory cell MC as sandwiched between both lines. The memory cell array 1 includes plural such memory cell mats MM stacked in multiple layers, as described above, in which the vertically adjacent memory cell mats MM share the word lines WL or the bit lines BL. In the case of FIG. 2, a memory cell mat MM0 in the lowermost layer of the memory cell array 1 and a memory cell mat MM1 adjacently located above the memory cell mat MM0 share the word lines WL00-WL02.

Hereinafter, a group of bit lines BL disposed on the same position in the memory cell mats MM, such as the bit lines BL00, BL10 and BL20, is referred to as a "bit line group". Similarly, a group of word lines WL disposed on the same position in the memory cell mats MM, such as the word lines WL00 and WL10, is referred to as a "word line group". In addition, as shown with the dotted-line in FIG. 2, a group of memory cells MC provided at the intersections of one bit line group and one word line group is referred to as a "memory cell group".

Figure 3A:
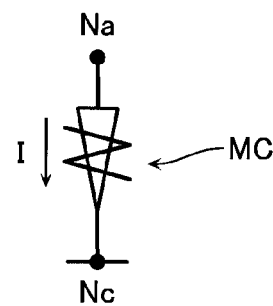
FIG. 3A is a diagram showing a circuit symbol of a memory cell in the semiconductor memory device according to the same embodiment.
Figure 3B:
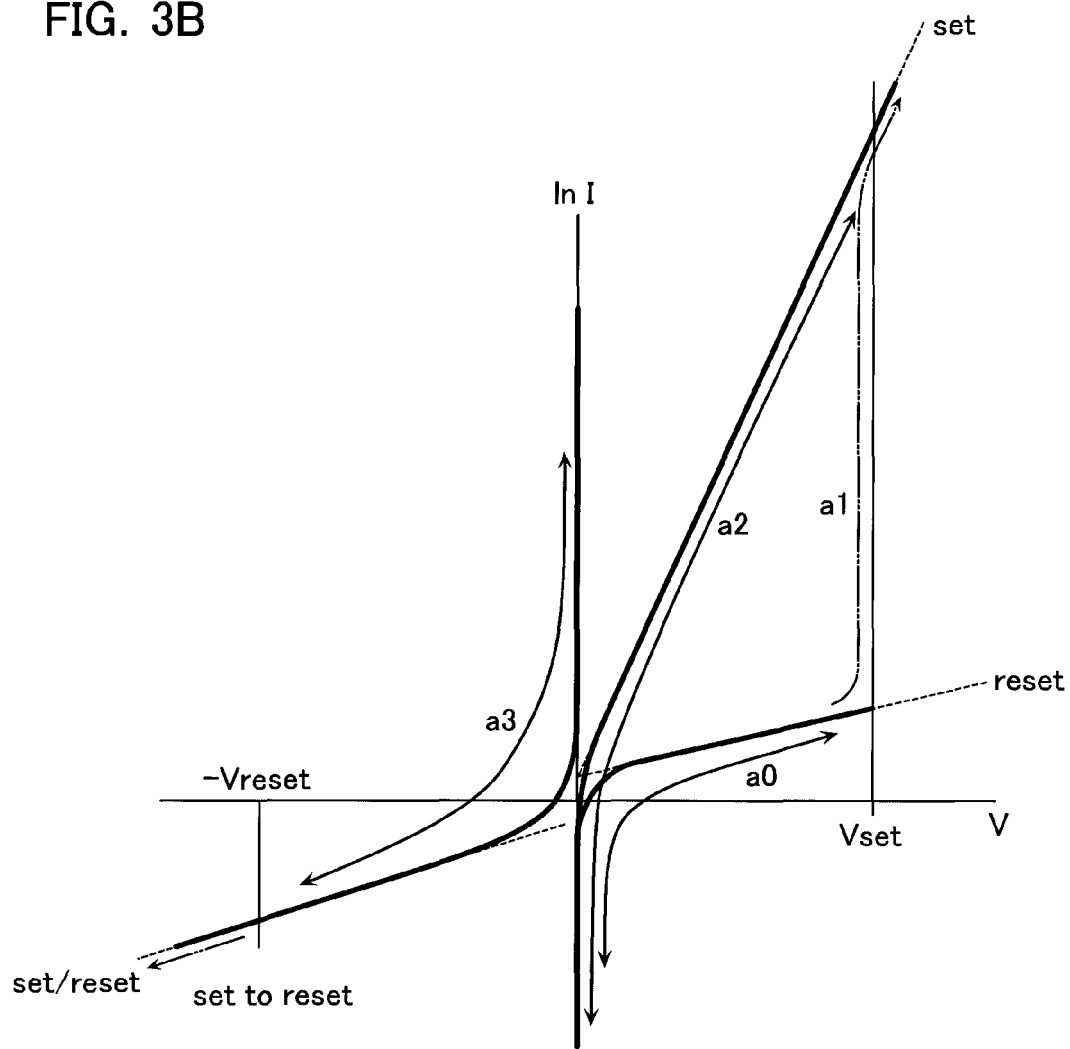
FIG. 3B is a diagram showing a voltage-current characteristic of the memory cell in the semiconductor memory device according to the same embodiment.

FIG. 3A is a diagram showing a circuit symbol of the memory cell MC. FIG. 3B is a diagram showing a voltage-current characteristic of the memory dell MC. Hereinafter, a node Na shown in FIG. 3A is referred to as the "anode", and a node Nc as the "cathode". The direction facing from the anode Na toward the cathode Nc shown by the arrow in FIG. 3A is referred to as the "forward direction", and the direction in reverse thereto as the "reverse direction. Therefore, a bias is the forward bias (first polarity) when the voltage on the cathode Nc is lower than that on the anode Na while a bias is the reverse bias (second polarity) when the voltage on the cathode Nc is higher than that on the anode Na.

The memory cell MC comprises a variable resistance element and stores data in accordance with different resistance states of the variable resistance element. Hereinafter, a state of the memory cell MC including the variable resistance element in the high resistance state (first resistance state) is referred to as a "reset state" while a state of the memory cell MC including the variable resistance element in the low resistance state (second resistance state) is referred to as a "set state". In addition, operation for changing the memory cell MC in the reset state into the set state is referred to as "set operation" while operation for changing the memory cell MC in the set state into the reset state is referred to as "reset operation". Therefore, write operation also contains "set operation" and "reset operation".

The memory cell MC has the property of a solid electrolyte. This is the property that makes the voltage-current characteristic asymmetrical in accordance with the direction of bias (the polarity of an applied voltage) as shown in FIG. 3B. As can be found from FIG. 3B, the voltage-current characteristic of the memory cell MC is such that the cell current can be approximated by $I \sim A \exp(\alpha V)$ (A and $\alpha$ are constants) except the vicinity of the applied voltage $V=0$. The coefficient $\alpha$ when the memory cell MC in the reset state is forward-biased is almost the same as that when the memory cell MC in the reset state is reverse-biased and that when the memory cell MC in the set state is reverse-biased. In contrast, the coefficient $\alpha$ when the memory cell MC in the set state is forward-biased becomes extremely large. Further, ln I becomes $\pm\infty$ in the vicinity of the applied voltage $V=0$.

When the memory cell MC in the reset state is forward-biased, the memory cell MC still remains in the reset state within a range of the applied voltage V from near 1V to a set voltage Vset. In this case, the cell current I flowing in the memory cell MC varies reversibly in accordance with variations in the applied voltage V (the arrow a0). When the applied voltage V becomes equal to or higher than the set voltage Vset, the state of the memory cell MC changes from the reset state to the set state irreversibly (set operation) (the arrow a1).

When the memory cell MC in the set state is forward-biased, on the other hand, the cell current I flowing in the memory cell MC varies reversibly in accordance with variations in the applied voltage V (the arrow a2). The memory cell MC in the set state, however, can make no transition to the reset state as far as it is forward-biased even when the applied voltage V is elevated.

When the memory cell MC in the reset state is reverse-biased, the cell current I flowing in the memory cell MC varies reversibly in accordance with variations in the applied voltage V (the arrow a3). The memory cell MC in the reset state, however, can make no transition to the set state as far as it is reverse-biased even when the applied voltage V is elevated.

When the memory cell MC in the set state is reverse-biased, on the other hand, the memory cell MC still remains in the set state within a range of the applied voltage from 0V, the reverse bias from 0V, to a voltage, −Vreset (hereinafter, Vreset is referred to as a "reset voltage"). In this case, the cell current I flowing in the memory cell MC varies reversibly in accordance with variations in the applied voltage V (the arrow a3). When the applied voltage V becomes equal to or lower than the voltage, −Vreset, the state of the memory cell MC changes from the set state to the reset state irreversibly (reset operation).

Figure 4:
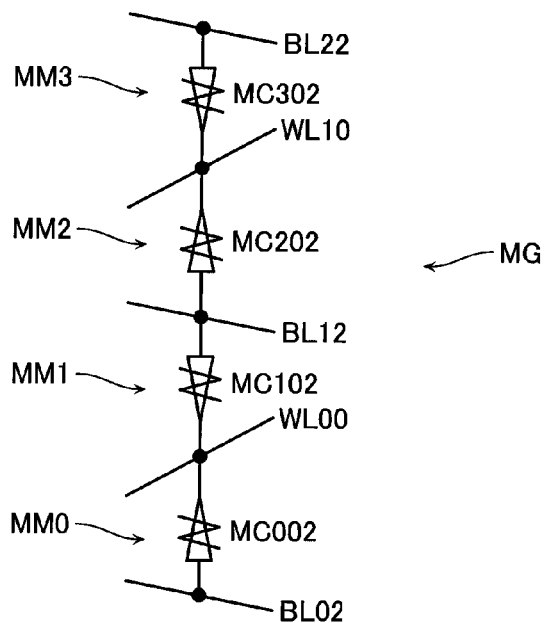
FIG. 4 is an equivalent circuit diagram of a part of the memory cell array in the semiconductor memory device according to the same embodiment.

FIG. 4 is an equivalent circuit diagram showing a part of the memory cell array 1, that is, the memory cell group MG shown with the dotted-line in FIG. 2. When a memory cell array 1 of the cross-point type having a three-dimensional structure is configured using the memory cells MC shown in FIGS. 3A and 3B, the memory cell mats MM are stacked in such a manner as shown in FIG. 4 that the upper and lower surfaces of the memory cells MC are inverted at every layer. For example, a memory cell MC002 in a memory cell mat MM0 and a memory cell MC102 in a memory cell mat MM1 adjacently located above the memory cell mat MM0 are arranged such that the upper and lower surfaces are inverted, sandwiching a word line WL00 shared by the memory cell mats MM0 and MM1. This is because, even when the vertically adjacent memory cell mats MM share the bit line BL or the word line WL, the memory cells MC are provided such that the direction facing from the bit line BL toward the word line WL becomes the forward direction in all memory cell mats MM.

<Access Operation to Memory Cell>

The following description is given to access operation to the memory cells MC in the semiconductor memory device having the above-described structure. Hereinafter, access operation is described using the memory cells MC of the bipolar-type shown in FIG. 3B. The method of access operation herein described, though, can be applied to memory cells in general when they have asymmetrical voltage-current characteristics.

In the present embodiment, at the time of selecting a certain memory cell MC in the memory cell mat MM, voltages, required for access operation, are applied to a bit line BL and a word line WL connected to the selected memory cell MC, and other bit lines BL and word lines WL are brought into the floating state. The floating state herein described is a state in which a certain potential is not supplied/applied from external. In other words, it corresponds to bringing at least one of bit lines BL and word lines WL connected to access-undesired memory cells MC into the floating state. Hereinafter, a bit line connected to the selected memory cell may also be referred to as a "selected bit line", a word line connected to the selected memory cell as a "selected word line", a bit line not connected to the selected memory cell as a "non-selected bit line", a word line not connected to the selected memory cell as a "non-selected word line", and a memory cell connected to at least one of a non-selected bit line and a non-selected word line as a "non-selected memory cell".

First, the basis is described on the possibility of making access to the selected memory cell MC through the method. The anode of the memory cell MC is connected to the bit line BL, and the cathode to the word line WL. Therefore, when a high voltage is applied to the bit line BL and a low voltage to the word line WL, the memory cell MC is forward-biased.

In the semiconductor memory device of the present embodiment, as described above, the bit lines BL and the word lines WL are shared by the vertically adjacent memory cell mats MM. When it is intended to select one of memory cells MC in a certain memory cell mat MM, the selected bit line BL and the selected word line WL having the selected memory cell MC at a cross-point are driven by the bit line driver 2' and the word line driver 3'. Current paths arising at this time in the memory cell array 1 are considered.

In the case of the semiconductor memory device of the present embodiment, the memory cell MC at the intersection of the selected bit line BL and the selected word line WL is selected. In this case, as the bit lines BL and the word lines WL are used upside down in the vertically adjacent memory cell mats MM, the current paths directing from the selected bit line BL toward the selected word line WL, except the current path passing through the selected memory cell MC, pass through 3 non-selected memory cells MC at the minimum (hereinafter the shortest current path passing through just 3 non-selected memory cells MC may be referred to as the "shortest current path"). In this case, the non-selected memory cell, through which the shortest current path passes second, is reverse-biased.

Figure 5:
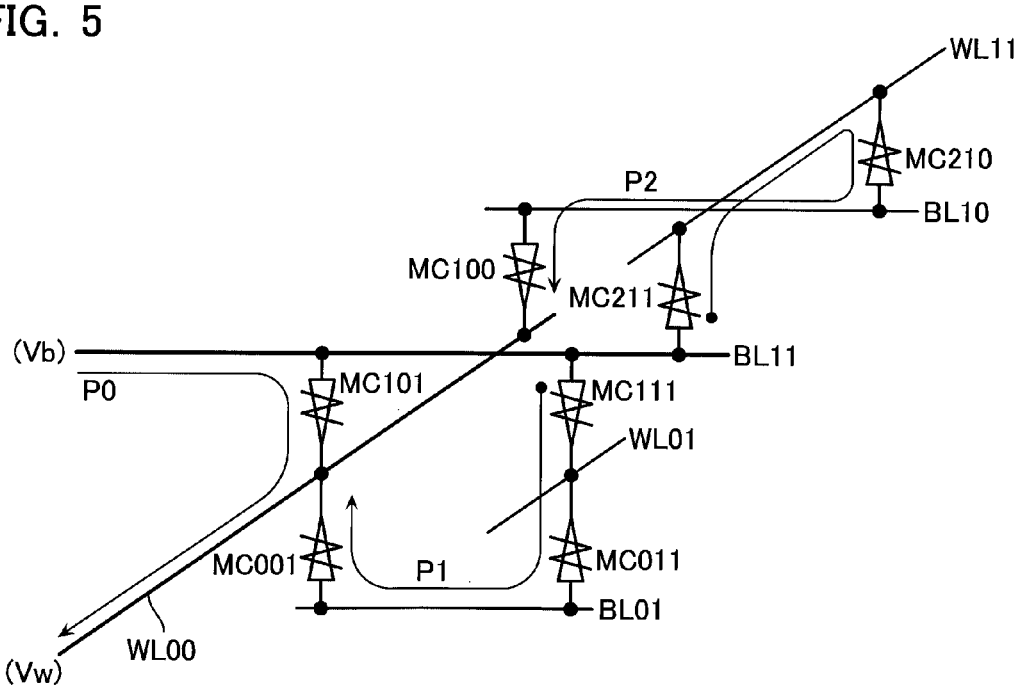
FIG. 5 is a diagram illustrative of a floating access method in the semiconductor memory device according to the same embodiment.

For example, in the memory cell array 1 shown in FIG. 5, a memory cell MC101 in a memory cell mat MM1 at the intersection of a bit line BL11 and a word line WL00 is regarded as the selected memory cell. This case is considered.

The selected bit line BL11 is applied with a voltage Vb and the selected word line WL00 with a voltage Vw lower than the voltage Vb. The voltage Vb-Vw is a voltage required for access operation to the memory cell MC. At this time, directing from the selected bit line BL11 toward the selected word line WL00, several current paths arise. The current path P0 is a current path directing from the selected bit line BL11 toward the selected word line WL00 via the selected memory cell MC101. Through this current path P0, the selected memory cell MC101 is applied with a forward bias of around the voltage Vb-Vw. The current path P1 is the shortest current path directing from the selected bit line BL11 toward the selected word line WL00 via non-selected memory cells MC111, MC011 and MC001. Through this current path P1, the memory cell MC011 is reverse-biased. Therefore, the memory cells MC111 and MC001 are applied with only a smaller voltage than the voltage Vb-Vw. The current path P2 is the shortest current path directing from the selected bit line BL11 toward the selected word line WL00 via memory cells MC211, MC210 and MC100. Through this current path P2, the memory cell MC210 is reverse-biased. Therefore, the memory cells MC211 and MC100 are applied with only a smaller voltage than the voltage Vb-Vw. In a word, it is possible to ensure that non-selected memory cells MC are applied with only a smaller voltage than the voltage applied to the selected memory cell MC.

The voltage applied to non-selected memory cells MC is a voltage that is derived from the voltage applied from the bit line driver 2' and the word line driver 3' to the selected bit line BL and the selected word line WL and divided by plural non-selected memory cells MC. It can be determined in a self-aligned manner at every location of the cell array mat MM.

In the case of the conventional memory cell array of the cross-point type, a constant bias is applied across non-selected memory cells to avoid failed access operation to non-selected memory cells. In the case of this access method, the middle point of the shortest current path is at a fixed voltage. Therefore, a considerably large bias is applied across non-selected memory cells depending on the locations of those arranged in the memory cell mat. As a result, the self-aligned situation is destroyed such that non-selected memory cells are considerably forced to receive the flow of cell current therein.

With this regard, in the case of the present embodiment, non-selected bit lines BL and non-selected word lines WL are brought into the floating state. Thus, only the voltages applied to the selected bit line BL and the selected word line WL are used as fixed conditions. Under such the conditions, the memory cell array 1 stabilizes at such a voltage distribution in a self-aligned manner that reduces the total amount of cell currents flowing in non-selected memory cells to a minimum. As a result, the current consumption in the memory cell array 1 at the time of access operation can be made lower than that in the conventional semiconductor memory device.

Hereinafter, the method of access operation of the present embodiment is referred to as a "floating access method".

<Access Procedure to Memory Cell>

The following description is given to the procedure of access to the memory cell MC through the floating access method. Herein described is a simple example with a target of 3×3 memory cell mats MM stacked in the memory cell array 1, in which access is made to a memory cell MC111 provided at the intersection of a bit line BL11 and a word line WL01 in a memory cell mat MM1.

Figure 6:
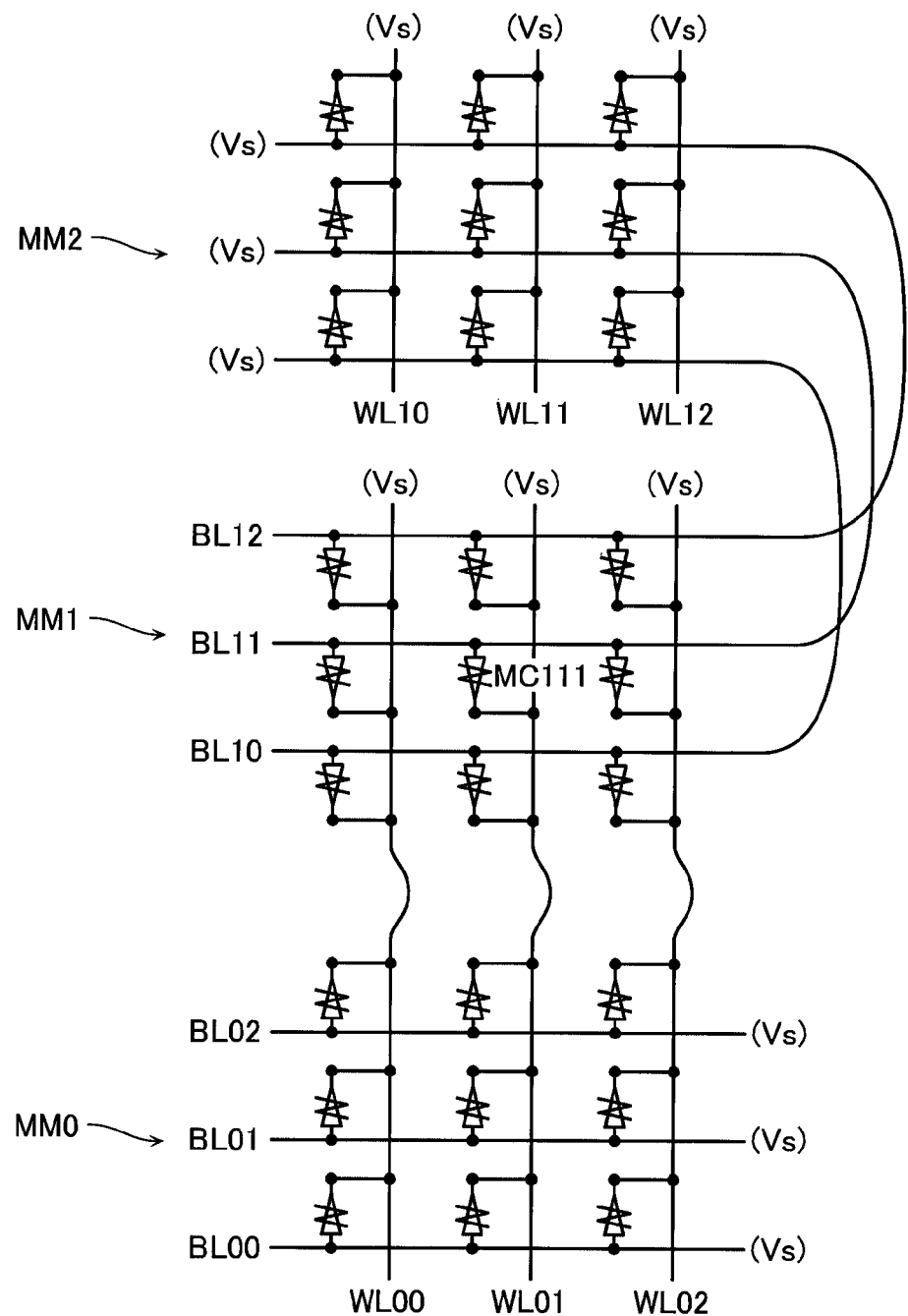
FIG. 6 is a diagram showing a bias state of the memory cell array in a standby state of the floating access method in the semiconductor memory device according to the same embodiment.

FIG. 6 is a diagram showing a state before access to the memory cell MC, that is, a bias state of the memory cell array 1 that retains the resistance state of the memory cell MC. Hereinafter, this state is referred to as a "stand-by state".

In the stand-by state, all bit lines BL and word lines WL are set to a voltage Vs (first voltage or fourth voltage) almost equal to the ground voltage. In the stand-by state, the resistance state of the memory cell MC is retained and thus data in the memory cell array 1 can be fixed. In the stand-by state, any memory cell MC is not biased.

Figure 7:
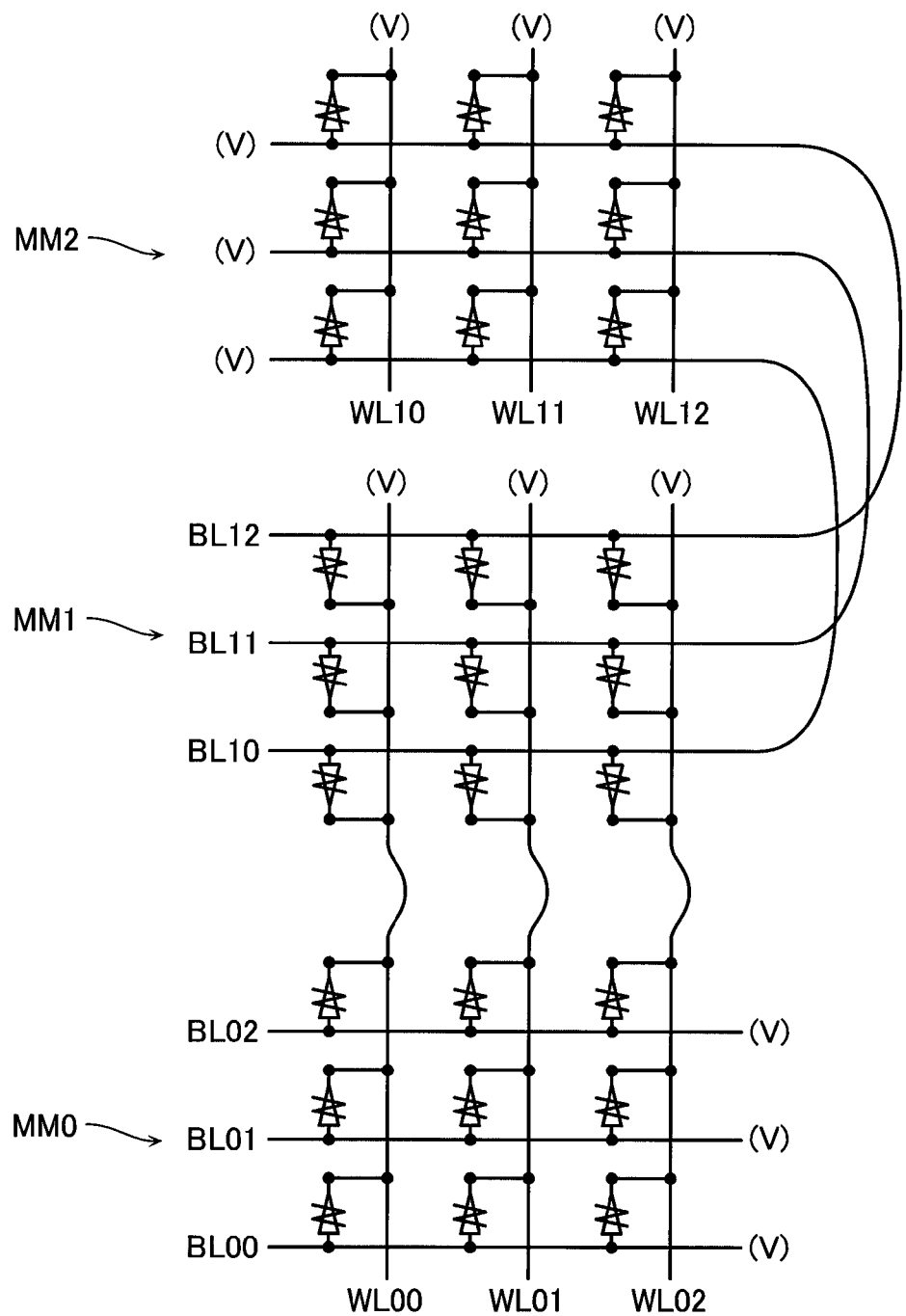
FIG. 7 is a diagram showing a bias state of the memory cell array in an active standby state of the floating access method in the semiconductor memory device according to the same embodiment.

FIG. 7 is a diagram showing a bias state of the memory cell array 1 immediately before access to the memory cell. MC. Hereinafter, this state is referred to as an "active stand-by state".

In the active stand-by state, all bit lines BL and word lines WL in the memory cell array 1 are set to a certain voltage V (second voltage or fifth voltage). This voltage V has different values in accordance with write operation (set operation and reset operation) and read operation. In the case of write operation, the voltage V becomes a voltage almost half the set voltage Vset, the reset voltage Vreset, or the voltage Vd near these voltages (~Vset/2, ~Vreset/2, or ~Vd/2). On the other hand, in the case of read operation, the voltage V becomes a voltage almost equal to an access voltage Vacc. The access voltage Vacc is a voltage set on the selected bit line BL at the time of read operation. This voltage is lower than the set voltage Vset and the reset voltage Vreset and thus it cannot change the state of the memory cell MC. Also in the active stand-by state, similar to the stand-by state, any memory cell MC is not biased.

The voltage V set on all bit lines BL and word lines WL in the active stand-by state is sufficient when it is equal to or lower than the maximum voltage set on the bit line BL or the word line WL in a later-described access state.

Therefore, it is possible to set the voltage to an appropriate value for the sense amplifier SA. For example, a setting of V=~Vacc/2 in the case of read operation or a setting of V=Vd in the case of write operation makes it possible to match the time for stabilizing the cell current with the activation of the sense amplifier SA. In addition, it may be possible to set different optimal voltages to the selected bit line, the non-selected bit lines, the selected word line, and the non-selected word lines, respectively.

Figure 8:
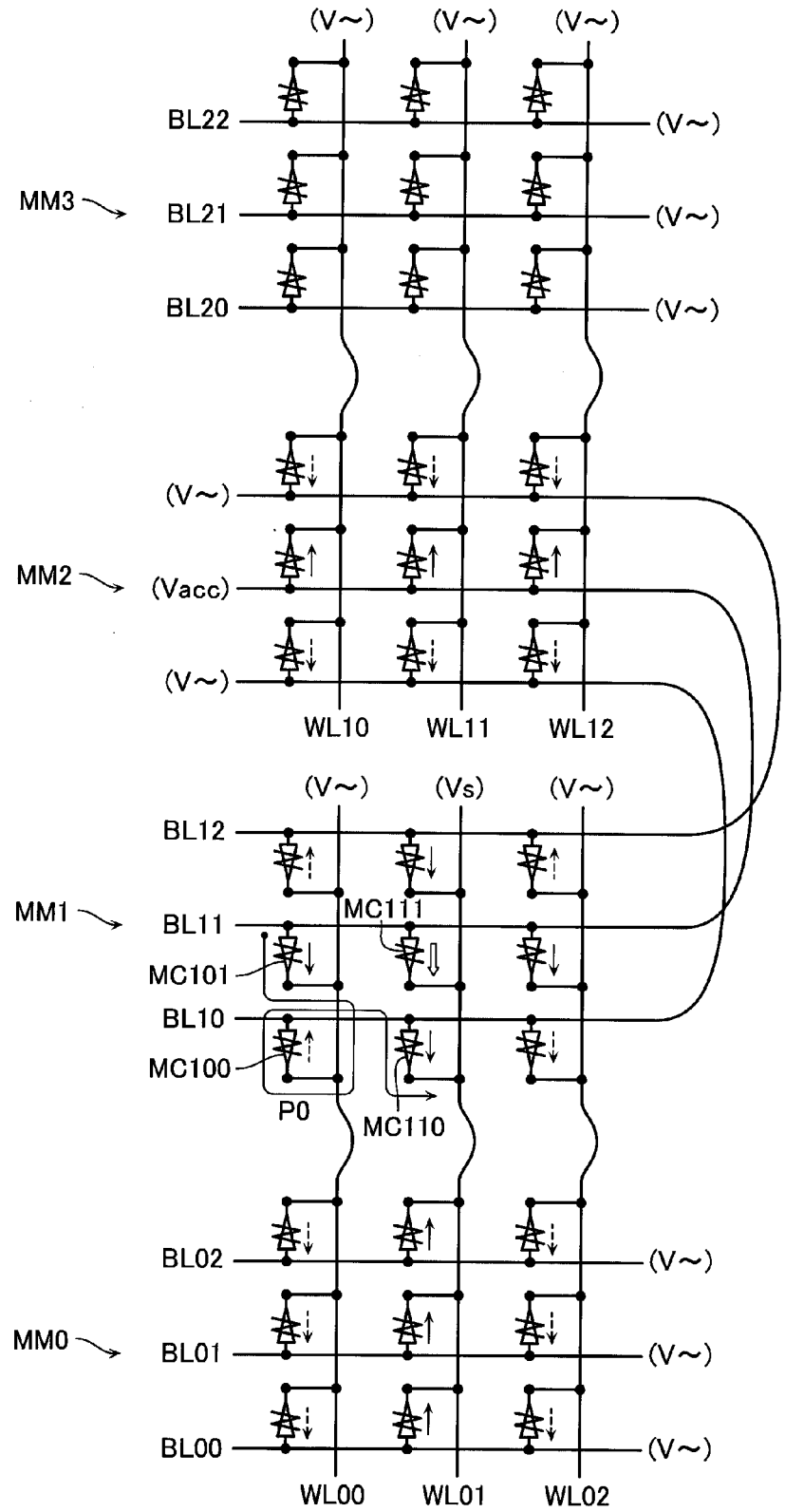
FIG. 8 is a diagram showing a bias state of the memory cell array in an access state of the floating access method in the semiconductor memory device according to the same embodiment.

FIG. 8 is a diagram showing a bias state of the memory cell array 1 when data is actually read out of the memory cell MC. Hereinafter, in addition to this state, a state in which the memory cell MC is actually changed to the set state, and a state in which the memory cell MC is actually changed to the reset state, described later, are each referred to as an "access state". Therefore, the access operation includes 3 states: the stand-by state, the active stand-by state and the access state.

In the access state of read operation (first access operation), the selected bit line BL is applied with an access voltage Vacc (third voltage) and the selected word line WL01 with the voltage Vs while non-selected bit lines BL and non-selected word lines WL are brought into the floating state. FIG. 8 uses V~ to represent the voltages on the bit lines BL and word lines WL in the floating state.

In this case, in the active stand-by state, all bit lines BL and word lines WL have been previously set to the voltage V=Vacc. Therefore, the selected bit line BL11 cannot charge the non-selected bit lines BL and non-selected word lines WL in the floating state. Therefore, the selected bit line BL11 rapidly exhibits the cell current in accordance with data in the selected memory cell MC111. When the cell current flowing in the selected bit line BL11 is sensed at the sense amplifier SA, the state (set state or reset state) of the selected memory cell MC111 can be determined. The set and reset states of the selected memory cell MC correspond to '0' and '1', respectively. Therefore, the determination of the state of the memory cell MC makes it possible to read out the data stored in the selected memory cell MC111.

The voltages on the bit lines BL and word lines WL in the floating state (voltage V~) can stabilize at certain voltages in a self-aligned manner in accordance with the locations of the memory cells MC arranged in the memory cell array 1. During the process, currents flow in non-selected memory cells MC as well. The currents flowing in non-selected memory cells MC can be roughly divided into an indirect forward current and an indirect reverse current. When the current flowing through the shortest current path passes through a non-selected memory cell on the way in the forward direction, the non-selected memory cell is referred to as an "indirect forward current flowing memory cell". When the current flowing through the shortest current path passes through a non-selected memory cell on the way in the reverse direction, the non-selected memory cell is referred to as an "indirect reverse current flowing memory cell". FIG. 8 shows a cell current flowing in the selected memory cell MC with a blank arrow, an indirect forward current flowing non-selected memory cell MC with a solid-line arrow, and an indirect reverse current flowing non-selected memory cell MC with a dotted-line arrow, respectively. The blank arrow, the solid-line arrow and the dotted-line arrow also indicate the directions of the flow of current.

For example, when an observation is applied to the shortest current path P0 directing from the selected bit line BL11 toward the selected word line WL01 via non-selected memory cells MC101, MC100 and MC110, an indirect forward current flows in the non-selected memory cells MC101 and MC110 while an indirect reverse current flows in the non-selected memory cell MC100.

In a word, the indirect forward current flows in the non-selected memory cell MC connected to the selected bit line BL11 or the selected word line WL01 while the indirect reverse current flows in the non-selected memory cell MC connected to the same non-selected bit line BL or non-selected word line WL as those connected to the indirect forward current flowing memory cells as can be found. In addition, the indirect forward current or indirect reverse current flowing non-selected memory cells MC can exist only within a range of the memory cell mat MM1 containing the selected memory cell MC111 and the memory cell mats MM0 and MM2 adjacently located above and beneath the memory cell mat MM1 and cannot exist in the memory cell mat MM3 not adjacent to the memory cell mat MM1 as can be found.

Figure 9:
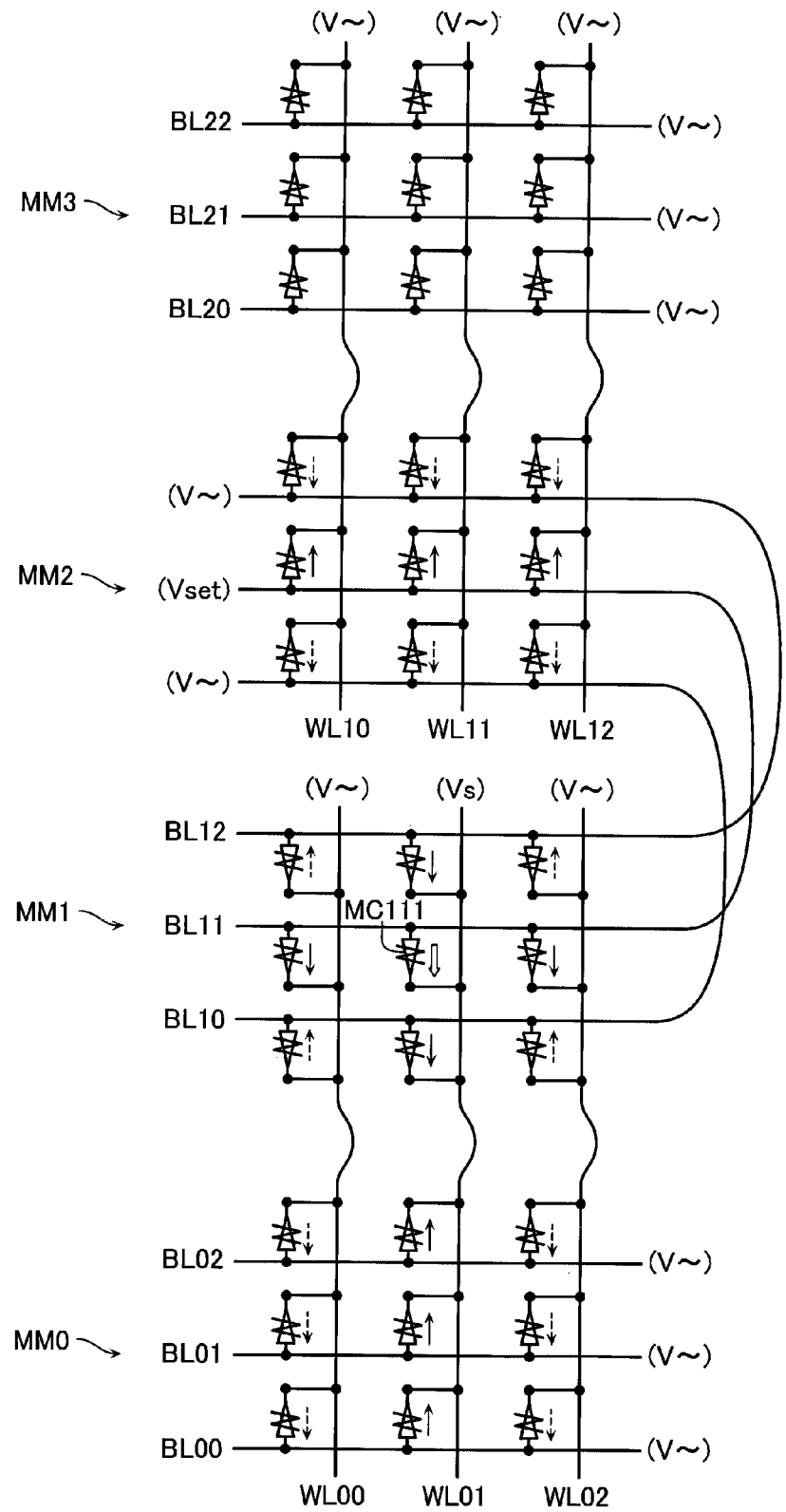
FIG. 9 is a diagram showing a voltage state of the memory cell array in an access state of the floating access method in the semiconductor memory device according to the same embodiment.

FIG. 9 is a diagram showing a bias state of the memory cell array 1 in the access state of set operation (first access operation) of the memory cell MC.

In the access state of set operation, the selected bit line BL11 is applied with the set voltage Vset (third voltage) and the selected word line WL01 with the voltage Vs while non-selected bit lines BL and non-selected word lines WL are brought into the floating state.

In this case, in the active stand-by state, all bit lines BL and word lines WL have been set to the voltage V=~Vset/2 previously. Therefore, the discharging current cannot concentrate on the selected word line WL01 and it is also supplied as the charging current to the selected bit line BL11. In addition, as for non-selected memory cells MC at locations far from the bit line driver 2' and close to the word line driver 3', it is possible to prevent a voltage near the set voltage Vset from being applied thereto even transiently.

The voltages on the bit lines BL and word lines WL in the floating state (voltage V~) can stabilize at certain voltages in a self-aligned manner in accordance with the locations of the memory cells MC arranged in the memory cell array 1. During the process, currents flow in non-selected memory cells MC as well. This point is the same as that in the access state of read operation. The voltage V is different in value, however, and accordingly the bias state of the memory cell array 1 and the transient variation in current are different therefrom.

Figure 10:
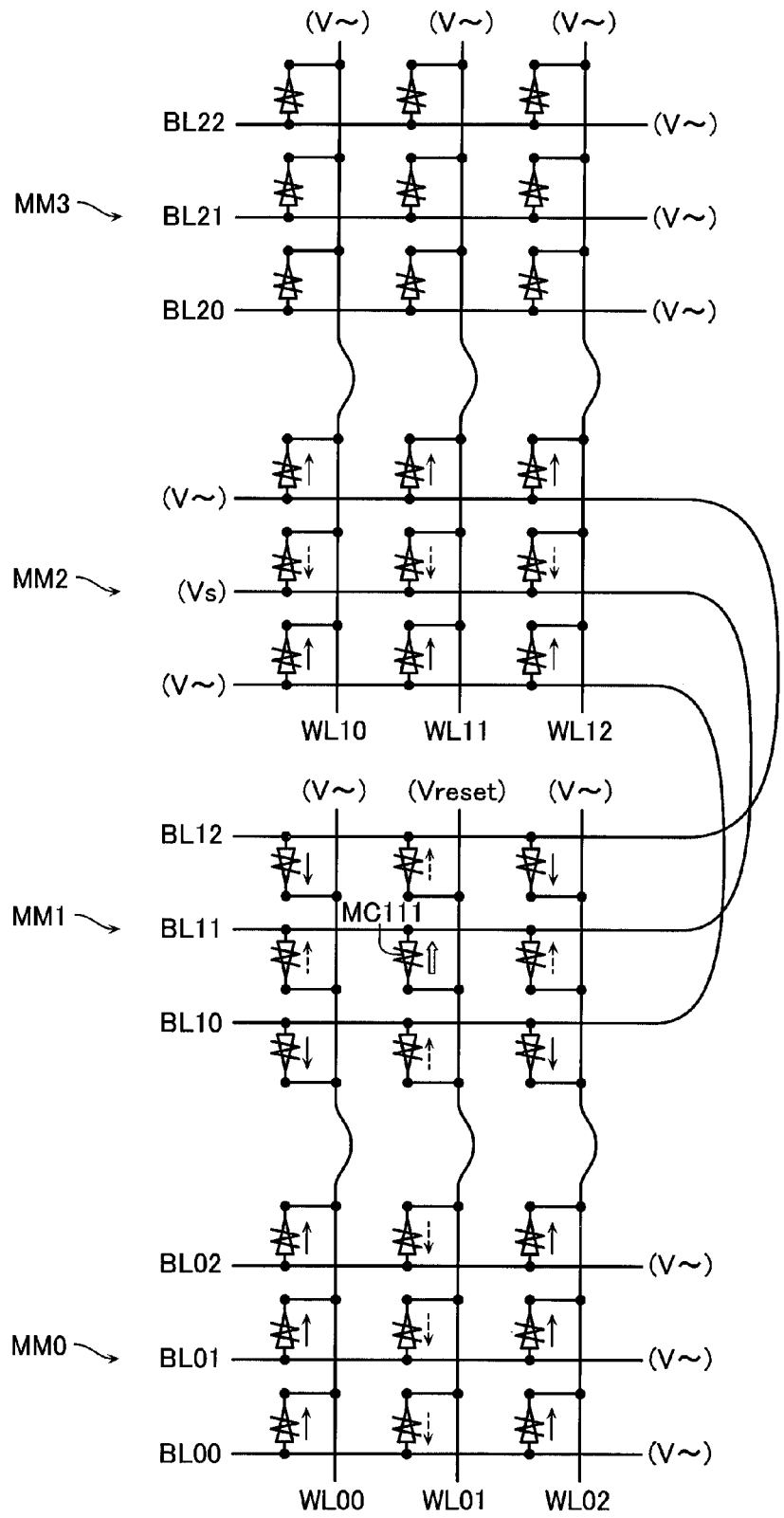
FIG. 10 is a diagram showing a bias state of the memory cell array in an access state of the floating access method in the semiconductor memory device according to the same embodiment.

FIG. 10 is a diagram showing a bias state of the memory cell array 1 in the access state of reset operation (second access operation) of the memory cell MC.

In the access state of reset operation, the selected bit line BL11 is applied with the voltage Vs and the selected word line WL01 with the reset voltage Vreset (sixth voltage). This is a bias state in reverse to that at the time of set operation. On the other hand, non-selected bit lines BL and non-selected word lines WL are brought into the floating state.

In this case, in the active stand-by state, all bit lines BL and word lines WL have been set to the voltage V=~Vreset/2 previously. Therefore, the discharging current cannot concentrate on the selected bit line BL11 and it is also supplied as the charging current to the selected word line WL01. In addition, as for non-selected memory cells MC at locations far from the word line driver 3' and close to the bit line driver 2', it is possible to prevent a voltage near the reset voltage Vreset from being applied thereto even transiently.

The voltages on the bit lines BL and word lines WL in the floating state (voltage V~) can stabilize at certain voltages in a self-aligned manner in accordance with the locations of the memory cells MC arranged in the memory cell array 1. During the process, currents flow in non-selected memory cells MC as well. This point is the same as that in the access state of read operation and set operation. The selected memory cell MC111 is brought into the reverse-biased state, however. For that purpose, the indirect forward current flowing non-selected memory cell MC and the indirect reverse current flowing non-selected memory cell MC become quite reverse to those in the access state of read operation and set operation.

The use of the above-described floating access method makes it possible to easily deal the occurrence of a defect in the memory cell array 1. This point is described next.

In the conventional semiconductor memory device, when it contains a faulty memory cell, the influence of access to other memory cells is considered. Therefore, the faulty memory cell is replaced by a spare memory cell or the faulty memory cell is isolated from the memory cell array in a circuit manner as measures provided therefor.

With this regard, in the case of the floating access method of the present embodiment, a faulty memory cell may short-circuit between the bit line BL and the word line WL connected to this faulty memory cell. Even in such the case, in the stand-by state and the active stand-by state, these bit line BL and word line WL have no voltage difference therebetween and cause no problem. In addition, in the access state, those other than the selected memory cell MC are in the floating state. Accordingly, the influence of the defect appears as variations in resistance distribution within the memory cell array 1. Therefore, as far as making access to the memory cell MC located far from the area containing the defect occurring portion, the influence can be neglected. Namely, at the time of read operation and write operation, an abnormal current flowing area and a failed operating area can be sufficiently indicated as access inhibited areas through the address management.

This is alike to that defect-containing areas are not used in magnetic discs and optical discs, and alike to that it is not dealt particularly as a memory element. It is possible, of course, to provide address information that inhibits making access to the inside as a memory element. The circuit system of the memory cell array, though, is not required to provide supports using the redundancy and so forth. It is possible to provide supports with the address management only.

Figure 11:
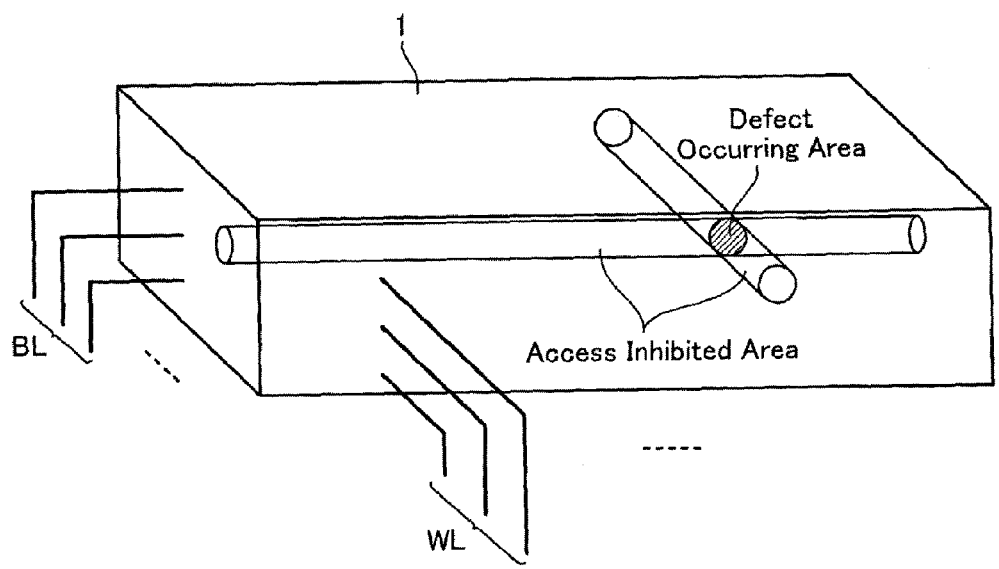
FIG. 11 is a diagram illustrative of a processing method at the time of defect occurring in the semiconductor memory device according to the same embodiment.

For example, a defect occurs at a certain portion in the memory cell array 1. At this time, in the worst case, as shown in FIG. 11, an access inhibited area arises about the defect occurring portion in a cross shape extending in the bit line BL direction and the word line WL direction. Depending on the type of the defect, even the access inhibited area contains normally accessible positions therein. They depend on when a fault occurs when making access thereto. Therefore, the addresses are managed in the state of actual use.

CONCLUSION

Thus, in accordance with the present embodiment, at the time of access operation, those other than the selected memory cell are brought into the floating state. Therefore, it is possible to reduce current consumption. In addition, it is only required to create the floating state. Accordingly, the peripheral circuits such as line drivers can be included in a small space. Further, when a defect occurs in the memory cell array, no special circuit is required to compensate for the defect but only the address management is required to deal it. Therefore, it is possible to provide a semiconductor memory device ready for mass file memories.

Second Embodiment

The first embodiment describes the making of access to one memory cell MC while a second embodiment describes the making of access to plural memory cells MC at the same time.

Described first is the execution of read operation to plural memory cells MC at the same time.

The asymmetrical variable resistance memory cell (memory cell MC) shown in FIGS. 3A and 3B varies the characteristic thereof when a large current flows continuously therein. Therefore, as for the bit lines BL used to monitor the cell current, it is required to select one memory cell at every line to monitor the cell current at every memory cell MC and control it.

Therefore, in the present embodiment, at the time of making access to plural memory cells MC at the same time, it is executed to select only one word line WL and select plural bit lines BL. The distance between the selected word line WL and the word line driver 3' is shortened to select as many bit lines BL as possible within the tolerable current of the selected word line WL.

Detection of the magnitude of the cell current Icell flowing in the selected bit line BL requires a reference bit line RBL in the same environment as the selected bit line BL. In read operation, the bit line BL and the reference bit line RBL, 2 bit lines at the minimum, are driven and the current flowing in the reference bit line RBL and the cell current Icell flowing in the selected bit line BL are compared in a sense amplifier SA provided on the selected bit line BL at one end. This comparison makes it possible to determine the resistance state of the selected memory cell MC, that is, the data stored in the selected memory cell MC.

The following description is given to the execution of set operation to plural memory cells MC at the same time.

In the case of set operation, one selected word line WL is applied with the voltage Vs and plural selected bit lines BL with the set voltage Vset while non-selected bit lines BL and non-selected word lines WL are brought into the floating state.

At the time of set operation, the sense amplifiers SA can be used. The sense amplifier SA connected to the selected bit line BL plays a role in monitoring the cell current as described above. Therefore, the sense amplifier SA is used to monitor the cell current Icell in the selected memory cell MC in set operation. Just when the sense amplifier SA senses an increase in the cell current Icell at the time of the transition from the reset state (high resistance state) to the set state (low resistance state), the bit line BL is isolated from the bit line driver 2'. This makes it possible to prevent an extra current from flowing in the selected memory cell MC and the characteristic of the selected memory cell MC from varying. This is made possible by monitoring the cell currents Icell flowing in the selected bit lines BL at the sense amplifiers SA individually.

The following description is given to the execution of reset operation to plural memory cells MC at the same time.

In the case of reset operation, one selected word line WL is applied with the reset voltage Vreset and plural selected bit lines BL with the voltage Vs while non-selected bit lines BL and non-selected word lines WL are brought into the floating state.

In the case of reset operation, the selected memory cell MC is reverse-biased. In this case, the cell current is extremely small due to the characteristic of the asymmetrical variable resistance memory cell as described using FIG. 3B. Therefore, the method of selecting the bit line BL does not become important. Accordingly, the selection decoder for use in set operation is diverted as it is, thereby selecting the bit line BL through the same method as that at the time of set operation.

In any of read operation, set operation and reset operation, the bit line BL receives only the cell current Icell flow caused by one memory cell MC. Therefore, the bit line BL can be made longer than the word line WL without problems. On the other hand, the word line WL drives plural bit lines BL including the reference bit line RBL at the same time. Therefore, when n bit lines BL including the reference bit line RBL are selected, the word line WL is required to tolerate the current of n×Icell.

In addition, plural bit lines BL are selected in such a manner that they are connected to the memory cells connected to the same word line WL.

Figure 12:
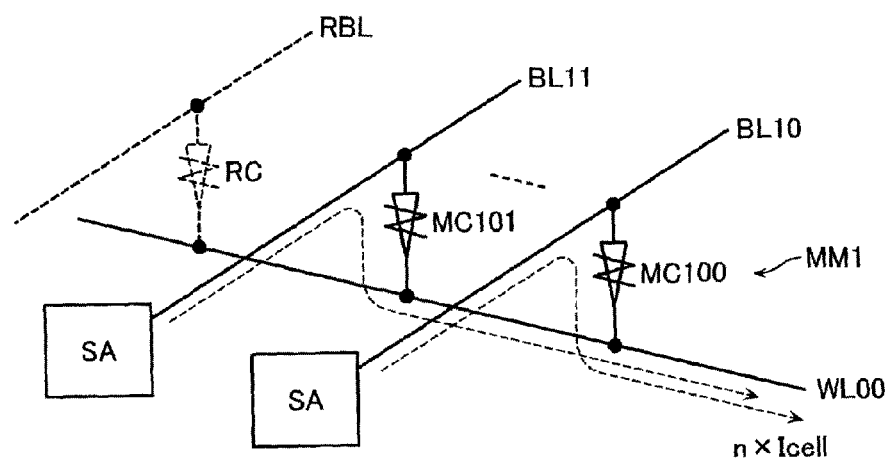
FIG. 12 is a diagram illustrative of an example in selecting a bit line and a word line in a semiconductor memory device according to a second embodiment.
Figure 13:
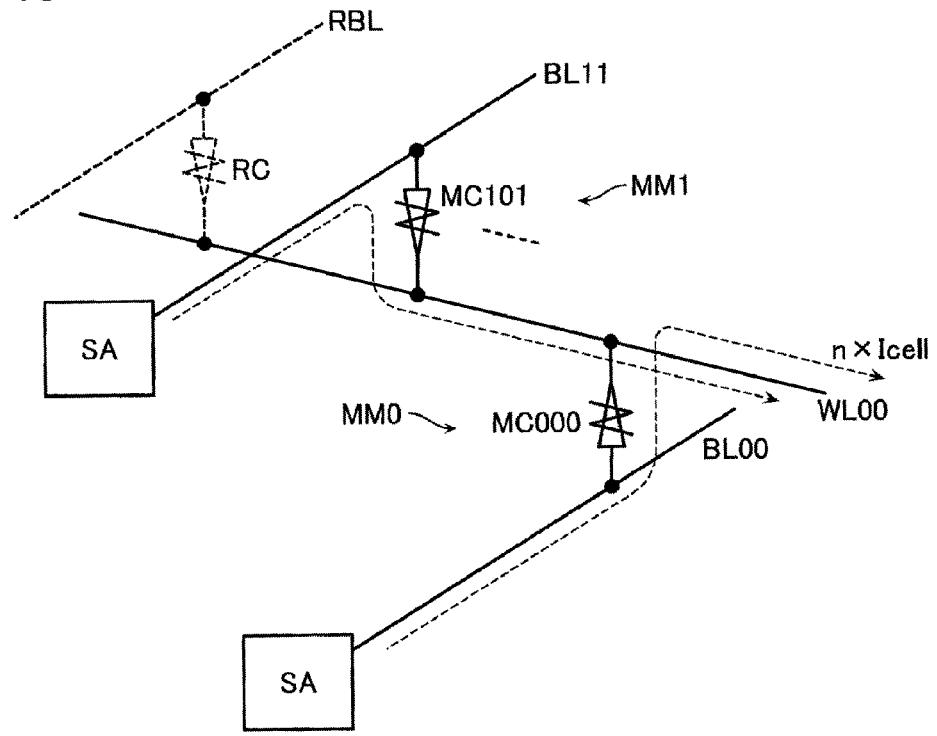
FIG. 13 is a diagram illustrative of an example in selecting a bit line and a word line in the semiconductor memory device according to the same embodiment.
Figure 14:
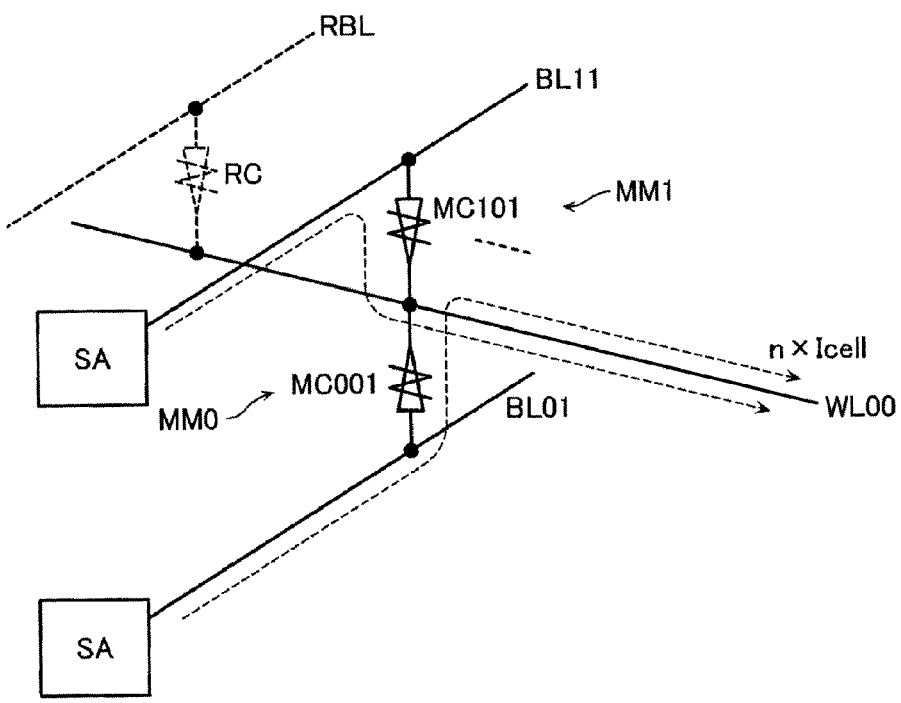
FIG. 14 is a diagram illustrative of an example in selecting a bit line and a word line in the semiconductor memory device according to the same embodiment.

FIGS. 12-14 show examples of selecting the bit lines BL according to the present embodiment. A memory cell and a bit line shown with the dotted-lines in FIGS. 12-14 show a reference cell RC and a reference bit line RBL, respectively.

FIG. 12 shows an example of selecting plural memory cells MC from the same memory cell mat MM. Selection of a word line WL00 and bit lines BL10 and BL11 makes it possible to make access to 2 memory cells MC100 and MC101 in a memory cell mat MM1 at the same time.

FIG. 13 shows an example of selecting plural memory cells MC from 2 vertically adjacent memory cell mats MM sharing one word line WL. Selection of a word line WL01 and bit lines BL00 and BL11 makes it possible to make access to a memory cell MC000 in a memory cell mat MM0 and a memory cell MC101 in the memory cell mat MM1 at the same time.

FIG. 14 also shows an example of selecting plural memory cells MC from 2 vertically adjacent memory cell mats MM sharing one word line WL similar to FIG. 13. In the case of FIG. 14, different from FIG. 13, the bit lines BL01 and BL11 belonging to the same bit line group are selected. This makes it possible to make access to a memory cell MC001 in the memory cell mat MM0 and the memory cell MC101 in the memory cell mat MM1 at the same time.

In addition to the examples shown in FIGS. 12-14, when falling within a range of memory cell mats MM sharing the same word line WL, it is possible to select plural bit lines BL arbitrarily within a range of tolerable current of the word line WL.

Thus, the present embodiment can exert the same effect as the first embodiment and additionally make access to plural memory cells at the same time. Therefore, it is possible to shorten the processing time in access operation.

Third Embodiment

A third embodiment describes a method of successively reading data from different memory cells. Hereinafter, read operation through this method is referred as "successive read operation".

The method of successive read operation can be considered in 2 ways. The first is a method of fixing the selected word line and sequentially switching and selecting among the bit lines at every access cycle. The second is a method of fixing the selected bit line and sequentially switching and selecting among the word lines at every access cycle. Of these methods, the second is more advantageous in the case of the floating access method.

Figure 15:
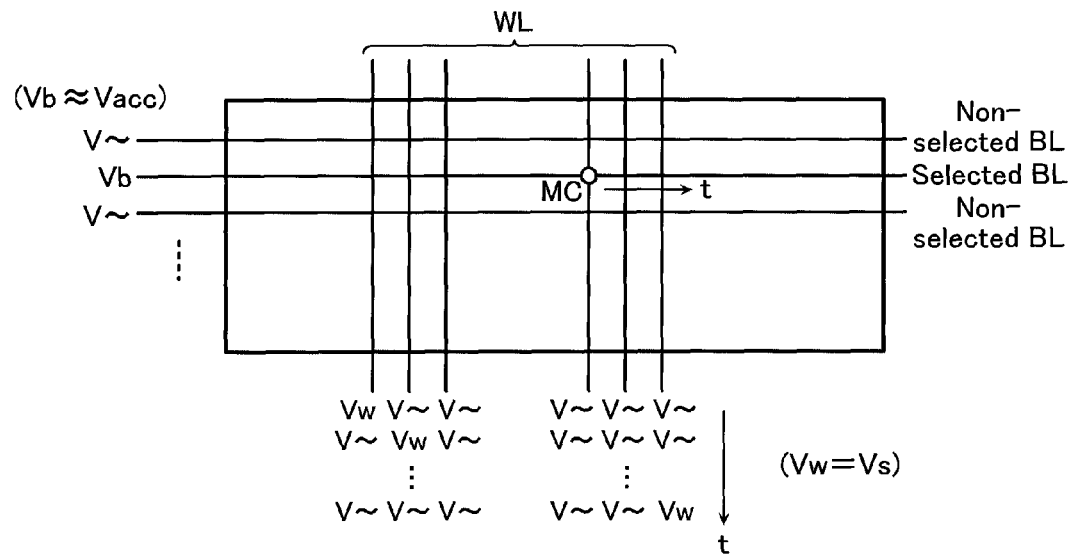
FIG. 15 is a diagram illustrative of read operation in a semiconductor memory device according to a third embodiment.
Figure 16:
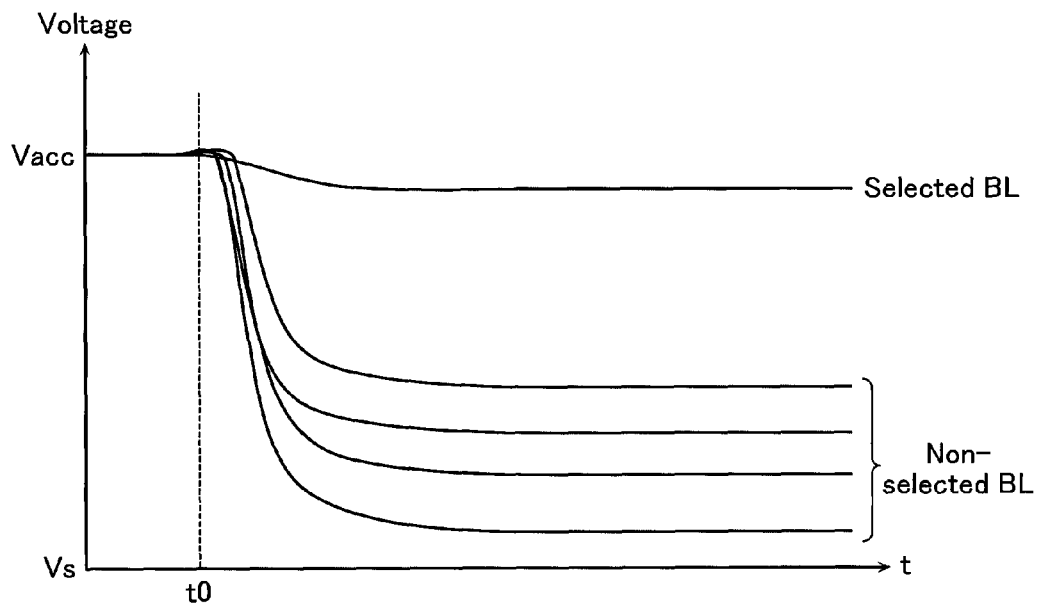
FIG. 16 is a diagram illustrative of variations in voltage on a selected bit line and non-selected bit lines in the semiconductor memory device according to the same embodiment.

FIG. 15 is a diagram illustrative of successive read operation in a semiconductor memory device according to the present embodiment. FIG. 16 is a diagram showing variations in voltage on bit lines when the floating access method of the present embodiment is used to make access to a memory cell once.

In read operation, as described in the first embodiment, in the active stand-by state, all bit lines BL and word lines WL are applied with the access voltage Vacc. Thereafter, in the access state, the selected bit line BL is applied with the access voltage Vacc and the selected word line WL with the voltage Vs while non-selected bit lines BL and non-selected word lines WL are brought into the floating state.

In this case, as shown in FIG. 16, the voltage Vb on the selected bit line BL hardly varies from the access voltage Vacc at the beginning of access operation at time t0. On the other hand, even though there are variations at every bit line BL, the voltage Vb on non-selected bit lines lowers toward the voltage Vs and accordingly lowers considerably lower than the access voltage Vacc.

Therefore, as in the second method, the voltage Vb on the bit line BL is fixed unchanged to reduce the variation in the bias state of the memory cell array 1. This makes it possible to execute successive read operation faster.

In a word, as shown in FIG. 15, the voltage Vb on the selected bit line BL is fixed to the access voltage Vacc (seventh voltage) while the selected word lines WL are switched sequentially. It is required to drive the selected word line WL with a voltage Vs (ninth voltage) near the ground voltage. In the case of the floating access method, those other than the selected word line WL are in the floating state and accordingly already discharged to near the voltage Vs. Therefore, when the selection of the word line WL is switched sequentially, the bias state of the memory cell array 1 cannot vary greatly.

In the case of successive read operation, it is required to initialize the sense amplifier SA at every access cycle of switching the selected word line WL.

Thus, the present embodiment can exert the same effect as that in the first embodiment. In addition, at the time of successive read operation, the use of the method of fixing the selected bit line and sequentially switching the selected word line makes it possible to provide a semiconductor memory device capable of executing high-speed and low-power consumption successive read operation.

Fourth Embodiment

A fourth embodiment describes a semiconductor memory device with plural word lines WL that share a word line driver 3'.

In the case of the floating access method, only the selected bit line BL and the selected word line WL are driven with certain voltages. In this case, when the word lines WL belong to different memory cell mats MM, they can share a word line driver 3'.

Described first is a range in the memory cell array 1 that varies the bias state when making access to a certain memory cell MC.

Figure 17:
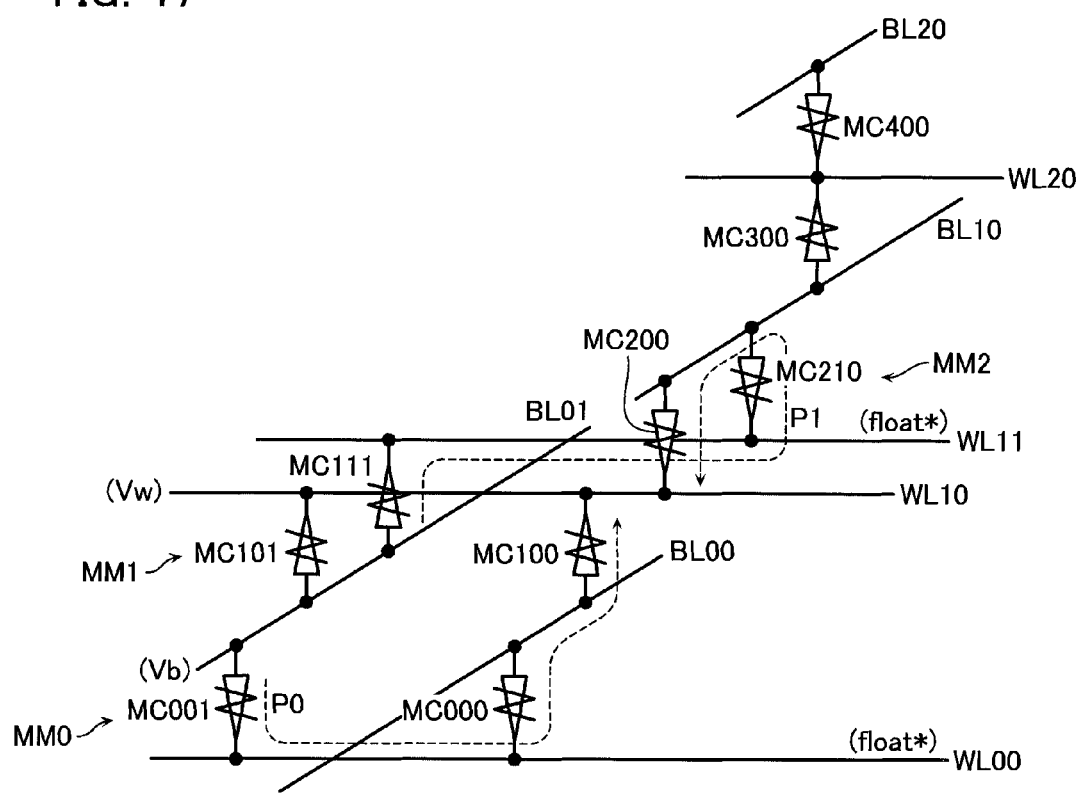
FIG. 17 is a diagram illustrative of the influence of current paths in an access state of the floating access method in a semiconductor memory device according to a fourth embodiment.

The voltage on the selected memory cell mat MM containing the selected memory cell MC exerts an influence mainly on memory cell mats MM, which are adjacently located above and beneath the selected memory cell mat MM, and through which the shortest current cell passes. In the example shown in FIG. 17, when making access to a memory cell MC101 in a memory cell mat MM1 provided at the intersection of a bit line BL01 and a word line WL10, the shortest current paths P0 and P1 arise as shown with the dotted-lines in FIG. 17. The current path P0 is a path directing via non-selected memory cells MC001 and MC000 in a memory cell mat MM0 adjacently located beneath the memory cell mat MM1 and a non-selected memory cell MC100 in the memory cell mat MM1 from the selected bit line BL10 toward the selected word line WL10. The current path P1 is a path directing via a non-selected memory cell MC111 in the memory cell mat MM1 and non-selected memory cells MC210 and MC200 in a memory cell mat MM2 adjacently located above the memory cell mat MM1 from the selected bit line BL10 toward the selected word line WL10. Thus, when making access to a memory cell MC in the memory cell mat MM1, two memory cell mats MM0 and MM2 adjacently located above and beneath form a range mainly susceptible to the influence as can be found. Hereinafter, this range is referred to as a "current path range". The word line represented by "float*" in FIG. 17 is a word line WL required to retain the floating state and stay on a self-aligned voltage.

When plural bit lines BL are selected as in the second embodiment, the selected memory cell MC falls within a range of 2 selected memory cell mats MM sharing the selected word line WL. When making access to plural memory cells MC at the same time, every 2 memory cell mats MM located above and beneath the layer of the selected word line WL form a main current path range.

In contrast, voltage setting in an area outside the main current path range hardly exerts an influence on the selected memory cell MC and the peripheral area thereof. Therefore, on condition that the word line shown with "float*" within the main current path range can be retained in the floating state and not fixed to a certain voltage, one word line driver 3' can be used to drive word lines in plural selected memory cell mats MM containing the selected memory cell mat MM at the same time. As a result, the word line driver 3' can be configured simple.

In the present embodiment, a word line driver 3' is shared by every other one of the word lines aligned in the direction of stacking the memory cell mats MM. In a word, in the same word line group, word lines WL even-numbered from the lower layer and word lines WL odd-numbered from the lower layer are grouped into respective sets and each set is determined to share one word line driver 3a' (first driver), 3b' (second driver).

If the selected word line WL is odd-numbered, the word line driver 3a' drives it with the voltage Vw together with other odd-numbered word lines WL at the same time. When the selected word line WL is even-numbered, the word line driver 3b' drives it with the voltage Vw together with other even-numbered word lines WL at the same time. Such the method of driving the word lines WL makes it possible to retain the bias state of the main current path range.

Figure 18:
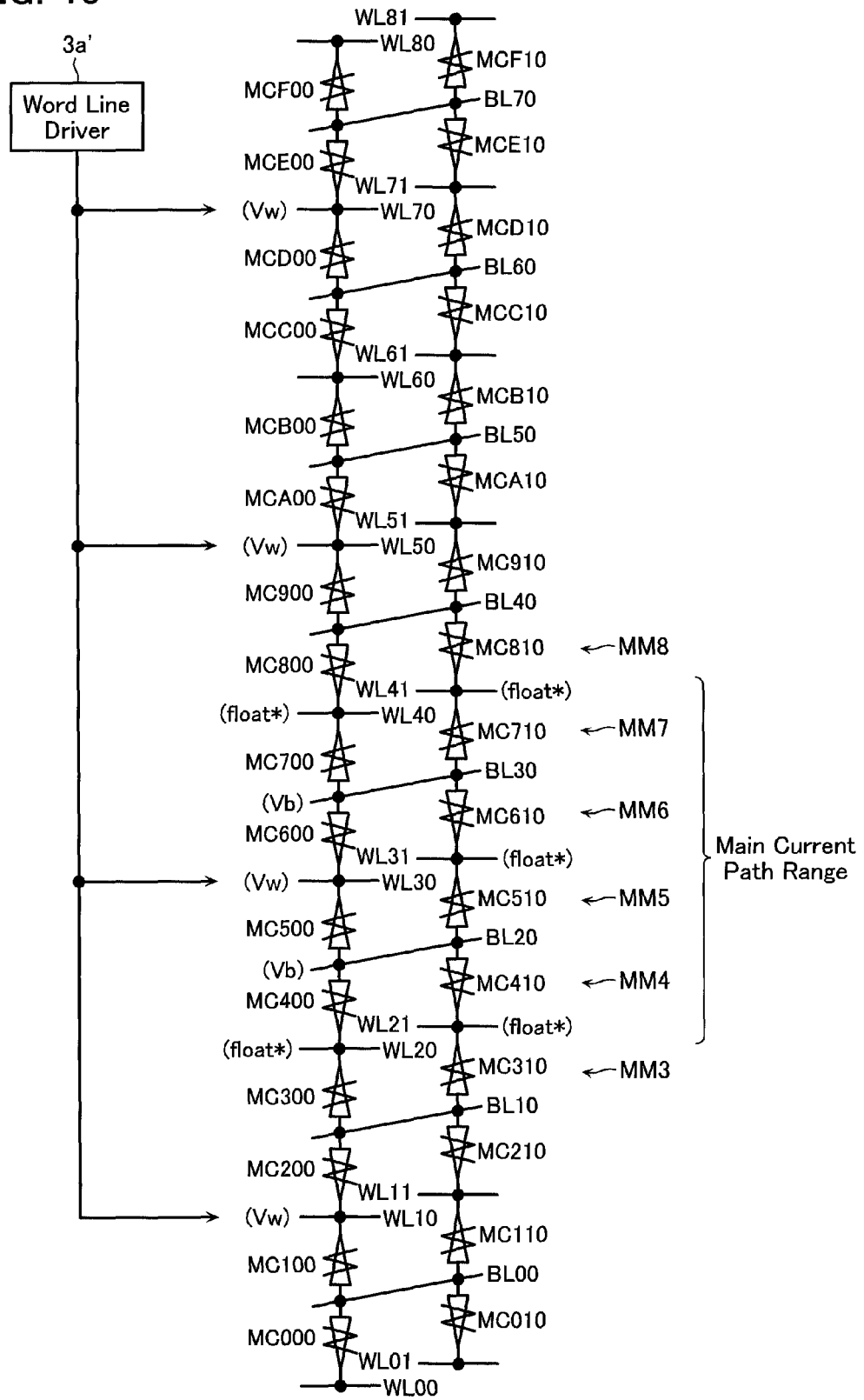
FIG. 18 is a diagram showing a bias state of the memory cell array in an access state of the floating access method in the semiconductor memory device according to the same embodiment.
Figure 19:
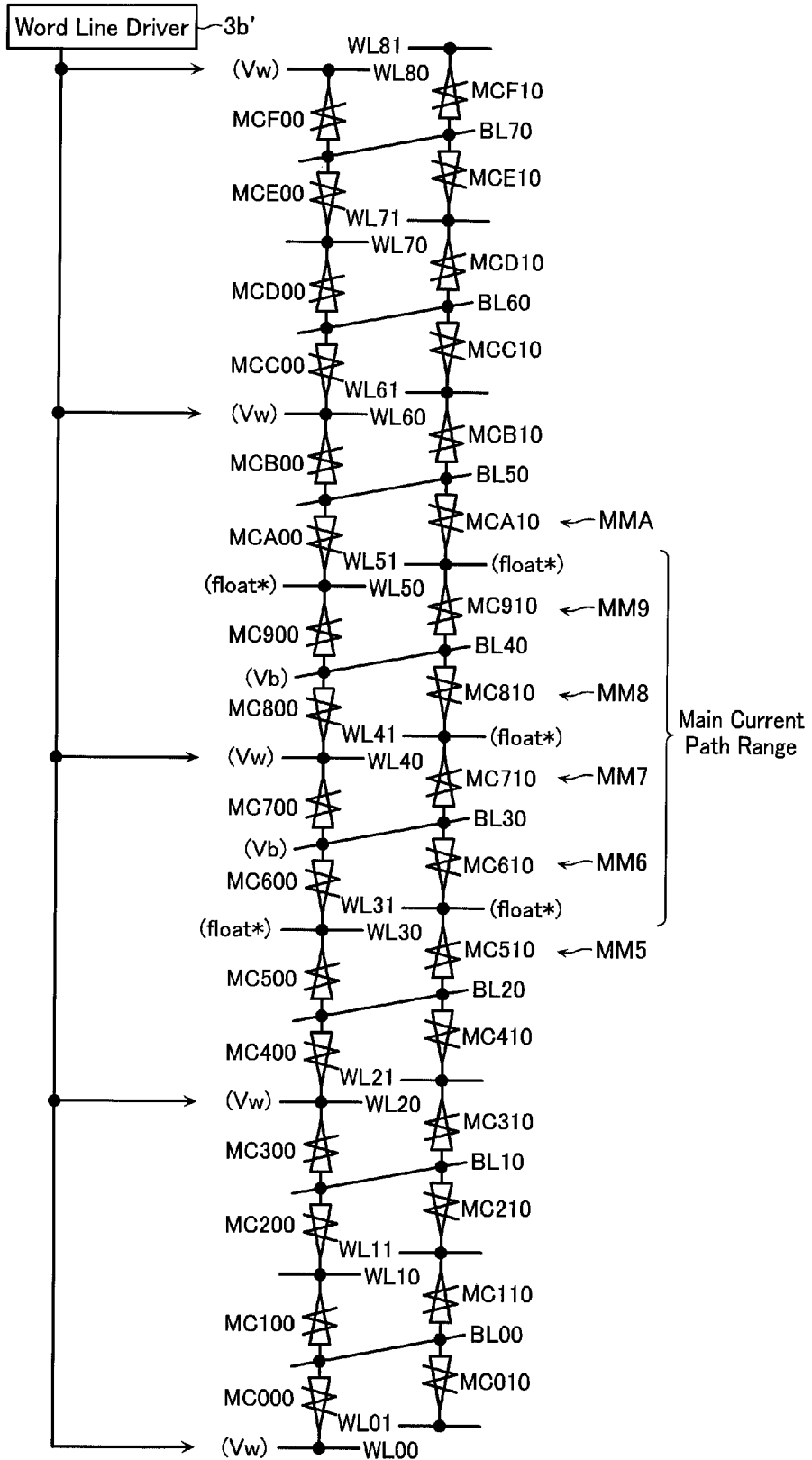
FIG. 19 is a diagram showing a bias state of the memory cell array in an access state of the floating access method in the semiconductor memory device according to the same embodiment.

FIGS. 18 and 19 provide diagrams showing the bias state of the memory cell array 1 when making access to a certain memory cell MC in the present embodiment. FIG. 18 shows the case when an odd-numbered word line WL is selected, and FIG. 19 shows the case when an even-numbered word line WL is selected. In the figure, "float*" shows a word line WL required to retain the floating state and stay on a self-aligned voltage, similar to FIG. 17.

The word lines WL are stacked from the lower through the upper layers WL00, WL01-WL80, WL81. Among those, odd-numbered word lines WL10, WL30, WL50 and WL70 share one word line driver 3a' as shown in FIG. 18. In addition, even-numbered word lines WL00, WL20, WL40, WL60 and L80 share one word line driver 3b' as shown in FIG. 19.

On selecting a memory cell MC500 in a memory cell mat MM5 and a memory cell MC600 in a memory cell mat MM6, as shown in FIG. 18, a memory cell mat MM4 adjacently located beneath the memory cell mat MM5 through a memory cell mat MM7 adjacently located above a memory cell mat MM6 form a main current path range. In this case, the odd-numbered word lines WL are applied with the voltage Vw from the word line driver 3a' while the even-numbered word lines WL are brought into the floating state. This makes it possible to apply the voltage Vw to the selected word line WL30 and bring non-selected word lines WL into the floating state within the current path range. As a result, non-selected memory cells MC are not applied with any extra voltage and only the selected memory cells MC500 and MC600 are subject to access operation.

On selecting a memory cell MC700 in a memory cell mat MM7 and a memory cell MC800 in a memory cell mat MM8, as shown in FIG. 19, the memory cell mat MM6 adjacently located beneath the memory cell mat MM7 through a memory cell mat MM9 adjacently located above a memory cell mat MM8 form a main current path range. In this case, the even-numbered word lines WL are applied with the voltage Vw from the word line driver 3b' while the odd-numbered word lines WL are brought into the floating state. This makes it possible to apply the voltage. Vw to the selected word line WL40 and bring non-selected word lines WL into the floating state within the current path range. As a result, non-selected memory cells MC are not applied with any extra voltage and only the selected memory cells MC500 and MC600 are subject to access operation.

Thus, the present embodiment can exert the same effect as that in the first embodiment. In addition, the word line driver 3' can be shared among plural memory cell mats MM. Therefore, it is possible to reduce the circuit scale of the row control circuit 3 and additionally provide a chip-downsized semiconductor memory device.

Fifth Embodiment

In a fifth embodiment, an embodiment is described on the configuration of a column control circuit 2 and a row control circuit 3 in a semiconductor memory device comprising a memory cell array 1 including plural memory cell mats MM stacked.

It is disadvantageous to provide a word line driver 3' individually at every word line WL in each memory cell mat MM in regard to the chip size. Therefore, the semiconductor device according to the present embodiment is configured to share one word line driver 3' at every word line block composed of a certain number of word line groups.

Figure 20:
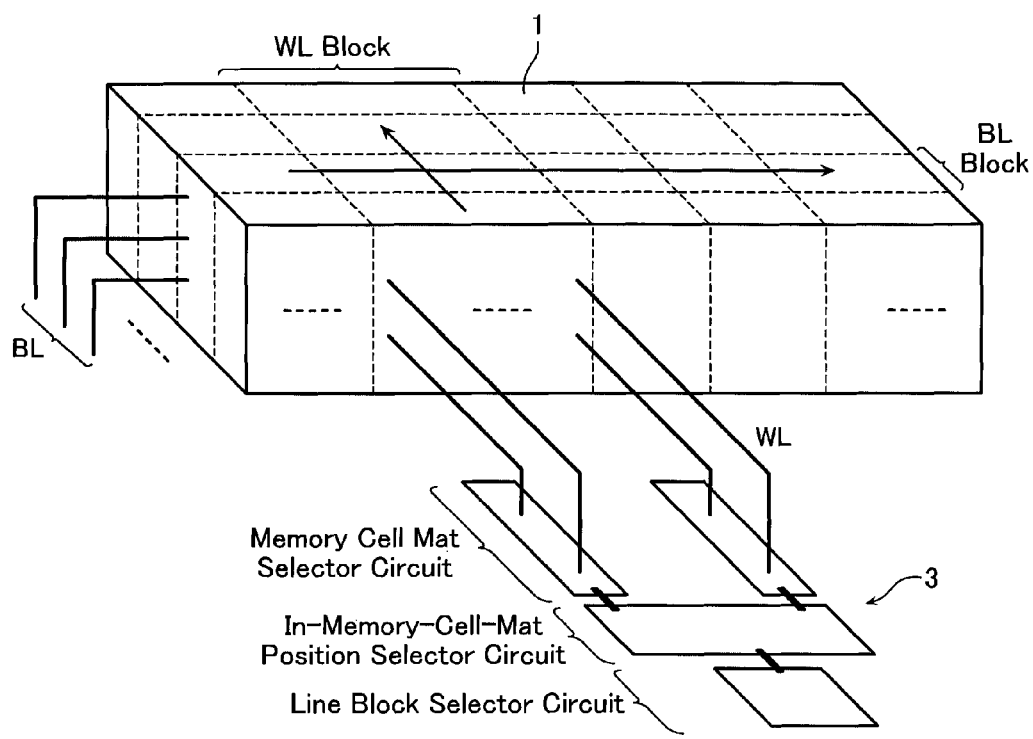
FIG. 20 is a diagram showing the configuration of a row control circuit in a semiconductor memory device according to a fifth embodiment.

FIG. 20 is a diagram showing the configuration of the row control circuit 3 in the semiconductor memory device according to the present embodiment. The row control circuit 3 includes, in addition to the word line driver 3', a memory cell mat selector circuit, an in-memory-cell-mat position selector circuit, and a line block selector circuit.

The line block selector circuit is provided one at every word line block. The line block selector circuit is a circuit operative to select a word line block that contains the selected word line WL in the memory cell array 1.

The in-memory-cell-mat position selector circuit is provided one at every word line block. The in-memory-cell-mat position selector circuit is a circuit operative to select the position of the selected word line WL in the memory cell mat MM. In other words, it is a circuit operative to select a word line group, which contains the selected word line WL, of the word line block selected at the line block selector circuit.

The memory cell mat selector circuit is provided one at every word line group. The memory cell mat selector circuit is a circuit operative to select a memory cell mat MM, which contains the selected word line WL, of the word line block selected at the line block selector circuit. As in the fourth embodiment, when it is intended to drive the word line group collectively as the set of odd-numbered word lines and the set of even-numbered word lines, the memory cell mat selector circuit is formed as a bifurcated selector circuit.

In the case of the configuration shown in FIG. 20, two selector circuits, that is, the in-memory-cell-mat position selector circuit and the memory cell mat selector circuit make it possible to select one word line WL in a certain memory cell mat MM. The voltage Vw supplied from the word line driver 3' is supplied to the selected word line WL via the line block selector circuit, the line group selector circuit and the memory cell mat selector circuit.

As for the column control circuit 2, similar to FIG. 20, it can be configured to share one bit line driver 2' at every bit line block composed of a certain number of bit line groups by providing a line block selector circuit, an in-memory-cell-mat position selector circuit and a memory cell mat selector circuit. As described in the fourth embodiment, however, in the case of the bit lines BL, one bit line driver 2' is not able to drive plural bit lines BL at the same time. Therefore, note that the memory cell mat selector circuit in the column control circuit 2 cannot be configured as a bifurcated selector circuit as in the row control circuit 3.

Thus, the present embodiment can exert the same effect as that in the first embodiment. In addition, the bit line driver 2' or the word line driver 3' may be provided at every line block. Therefore, it is possible to provide a chip-downsized semiconductor memory device.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device, comprising:
   a memory cell array including a memory cell layer, said memory cell layer containing plural first lines, plural second lines intersecting said first lines, and plural memory cells provided at the intersections of said plural first lines and second lines and operative to store data in accordance with different resistance states; and
   an access circuit operative to make access to said memory cells via said first lines and second lines,
   said memory cell changing said resistance state from a first resistance state to a second resistance state on application of a certain voltage of a first polarity, and changing said resistance state from a second resistance state to said first resistance state on application of a certain voltage of a second polarity opposite in polarity to said first polarity, and
   said access circuit applying voltages, required for access to said memory cell, to said first line and said second line connected to a selected memory cell, and bringing at least one of said first lines and said second lines connected to non-selected memory cells into a state in which a certain potential is not supplied/applied from external to make access to said selected memory cell, wherein
   said access circuit, on a first access operation for making access to said selected memory cell, sets said plural first lines and said plural second lines to a first voltage,
   then sets said plural first lines or said plural second lines to a second voltage higher than said first voltage,
   then sets said first line connected to said selected memory cell to a third voltage equal to or higher than said second voltage, sets said second line connected to said selected memory cell to said first voltage, and brings at least one of said first lines and said second lines connected to said non-selected memory cells into the floating state.

2. A semiconductor memory device, comprising:
   a memory cell array including a memory cell layer, said memory cell layer containing plural first lines, plural second lines intersecting said first lines, and plural memory cells provided at the intersections of said plural first lines and second lines and operative to store data in accordance with different resistance states; and an access circuit operative to make access to said memory cells via said first lines and second lines, said memory cell changing said resistance state from a first resistance state to a second resistance state on application of a certain voltage of a first polarity, and changing said resistance state from a second resistance state to said first resistance state on application of a certain voltage of a second polarity opposite in polarity to said first polarity, and said access circuit applying voltages, required for access to said memory cell, to said first line and said second line connected to a selected memory cell, and bringing at least one of said first lines and said second lines connected to non-selected memory cells into a state in which a certain potential is not supplied/applied from external to make access to said selected memory cell, wherein said access circuit, on a second access operation for making access to said selected memory cell, sets said plural first lines or said plural second lines to a fourth voltage, then sets said plural first lines and said plural second lines to a fifth voltage higher than said fourth voltage, then sets said second line connected to said selected memory cell to a sixth voltage equal to or higher than said fifth voltage, sets said first line connected to said selected memory cell to said fourth voltage, and brings at least one of said first lines and said second lines connected to said non-selected memory cells into the floating state.

3. The semiconductor memory device according to claim 1, wherein said access circuit, when a defective portion exists in said memory cell array, executes address management to an access inhibited area containing said defective portion, and makes access to memory cells outside said access inhibited area under said address management.

4. The semiconductor memory device according to claim 2, wherein said access circuit, when a defective portion exists in said memory cell array, executes address management to an access inhibited area containing said defective portion, and makes access to memory cells outside said access inhibited area under said address management.

* * * * *